United States Patent [19]

Nicholson et al.

[11] Patent Number: 4,902,943

[45] Date of Patent: Feb. 20, 1990

[54] PLUG-IN STARTING AID

[75] Inventors: Judith A. Nicholson; Omer E. Murray, Jr.; Carl D. Taylor, all of Hendersonville, N.C.

[73] Assignee: General Electric Company, Schenectady, N.Y.

[21] Appl. No.: 357,620

[22] Filed: May 23, 1989

Related U.S. Application Data

[63] Continuation of Ser. No. 117,427, Nov. 2, 1987, abandoned, which is a continuation of Ser. No. 446,804, Dec. 3, 1982, abandoned.

[51] Int. Cl.[4] .......................... H05B 39/00; H05K 7/20

[52] U.S. Cl. .......................... 315/289; 315/258; 315/290; 315/101; 361/386; 439/40

[58] Field of Search ............... 315/101, 258, 289, 290; 361/386; 439/12, 17, 18, 32, 40

[56] References Cited

U.S. PATENT DOCUMENTS

| | | | |
|---|---|---|---|
| 2,626,223 | 1/1953 | Sattler | 339/17 A |
| 2,922,054 | 1/1960 | Miller | 310/71 |
| 3,842,212 | 10/1974 | Miller | 339/17 LC |
| 3,917,976 | 11/1975 | Nuckolls | 315/258 |
| 4,225,209 | 9/1980 | Hughes | 339/17 LC |
| 4,305,633 | 12/1981 | Enberg et al. | 339/17 LC |
| 4,353,108 | 10/1982 | Chippel | 361/386 |
| 4,381,476 | 4/1983 | Adachi et al. | 315/290 |
| 4,409,641 | 11/1983 | Jakob et al. | 339/17 LC |
| 4,418,976 | 12/1983 | Lenzini et al. | 339/17 LC |
| 4,426,774 | 1/1984 | Stuckey | 339/17 LC |
| 4,438,372 | 3/1984 | Zuchtriegel | 315/290 |

OTHER PUBLICATIONS

"Materials Engineering 1983 Materials Selector" by John C. Bittence: pp. 1–4; Dec. 1982.

*Primary Examiner*—Donald J. Yusko
*Assistant Examiner*—Brian S. Palladino
*Attorney, Agent, or Firm*—John P. McMahon; Stanley C. Corwin; Fred Jacob

[57] ABSTRACT

A plug-in starting aid for generating high voltage pulses in the ballast circuit of high intensity discharge lamp comprises interconnected electrical components mounted in a frame of insulating material. The frame has three terminals projecting out one side and engageable in the cooperating terminals of a connector block in which the starting in may be plugged in. The terminals are also engageable by standard mating wire terminals when the starting aid is used without a connector block.

14 Claims, 2 Drawing Sheets

PLUG-IN STARTING AID

This application is a continuation, of application Ser. No. 117,427, filed 11/02/87, now abandoned which in turn, is a continuation of application Ser. No. 446,804 filed 12/03/82 now abandoned.

The invention relates to starting aids used with conventional ballasts for applying high voltage starting pulses to high intensity discharge lamps.

BACKGROUND

High intensity discharge lamps utilizing metal vapors as the discharge medium generally require a starting voltage substantially higher than the operating voltage and this is particularly so with high pressure sodium vapor lamps. For such lamps so-called starting aids have become available which are combined with otherwise conventional ballasts to generate a series of high frequency pulses which initiate the breakdown in the lamp.

One very effective starting aid is described in U.S. Pat. No. 3,917,976—Nuckolls, Starting and Operating Circuit for Gaseous Discharge Lamps. It comprises a charging capacitor and a voltage sensitive switch device such as a SIDAC which are connected to form a series discharge loop with a number of turns at the output end of the ballast's reactor or at the output end of the secondary side of the ballast transformer. In addition it comprises a resistor and a high frequency choke coil which are connected in series with the capacitor across the lamp load, that is across the high pressure sodium vapor lamp. Three connections are required to be made from the starting aid into the ballast-lamp circuit, a connection to the high side of the lamp, a connection to a tap near the output end of the ballast, and a connection to the low side of the lamp.

Up to the present one or the other of two approaches have been used with regards to starting aids. One was to attach the components to a flat board or to a printed circuit board and provide additional individual connectors into the ballast-lamp circuit. The other was to encapsulate the components in some suitable material and again provide additional individual connectors into the ballast-lamp circuit. With either of these approaches, the assembly of a starting aid into the lamp ballast circuit in a luminaire or its replacement in the field required mounting the starting aid within the luminaire by means of a suitable bracket and then attaching the individual wires to the terminals of the starting aid. In some situations heat generating components mounted close to the starting aid board have increased the cooling burden and encapsulation on the whole tends to do the same thing. Also with flat board designs, the starting aid needs to be mounted in restricted orientations in order to prevent accumulation of contaminants from causing arcing between live parts.

SUMMARY OF THE INVENTION

Among the objects of the invention are to provide a new and improved starting aid which is low in cost and has better component cooling, which can be plugged in or unplugged for change outs but which can also be wired with leads in a conventional manner when desired, which has positive snap retention when plugged in so that it will remain in place during shipping or in use notwithstanding vibration, but which is easy to disconnect for removal by the customer, and which can also be easily mounted by itself without requiring a special mounting bracket.

In accordance with our invention the starting aid components are mounted within a frame of insulating material provided with standard configuration terminals along one edge which can be plugged directly into a connector block but which can also be used with standard mating wire terminals.

In a preferred embodiment the frame is made of plastic molded around the terminal connectors and has stand-offs and clearances so that it can be mounted flat or standing up against metal parts without requiring an insulating barrier. When the starting aid is plugged into a connector block, a snap retention feature holds it securely in place but allows easy unplugging.

DETAILED DESCRIPTION

Figure 1:
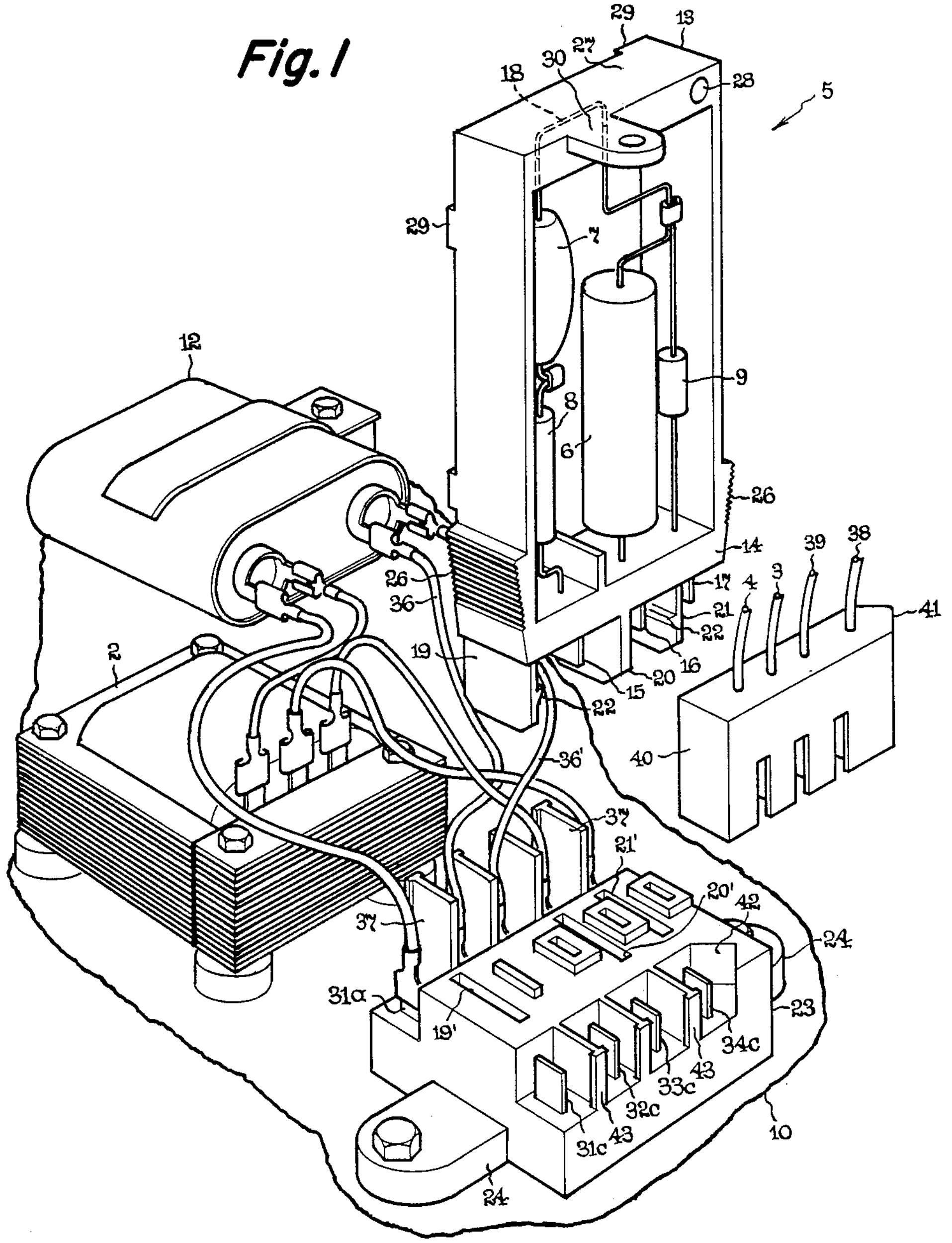
FIG. 1 shows pictorially a starting aid embodying the invention in exploded relationship above a connector block and associated ballast components.

The ballast components illustrated in FIG. 1 are typical of those found in the power module 10 of a low wattage high pressure sodium lamp luminaire. They comprise a series reactor 2 and a line power factor improvement capacitor 12. A plug-in starting aid 5 embodying the invention is shown poised above a multifunction connector block 23 which also accepts a four conductor disconnect plug 40 which connects the power module to the line supply and to the lamp. The connector block is fully described in our copending application Ser. No. 446,805, filed of same date herewith, entitled Multifunction Connector and assigned to the same assignee as the present invention, and the disclosure thereof is incorporated herein by reference.

Figure 2:
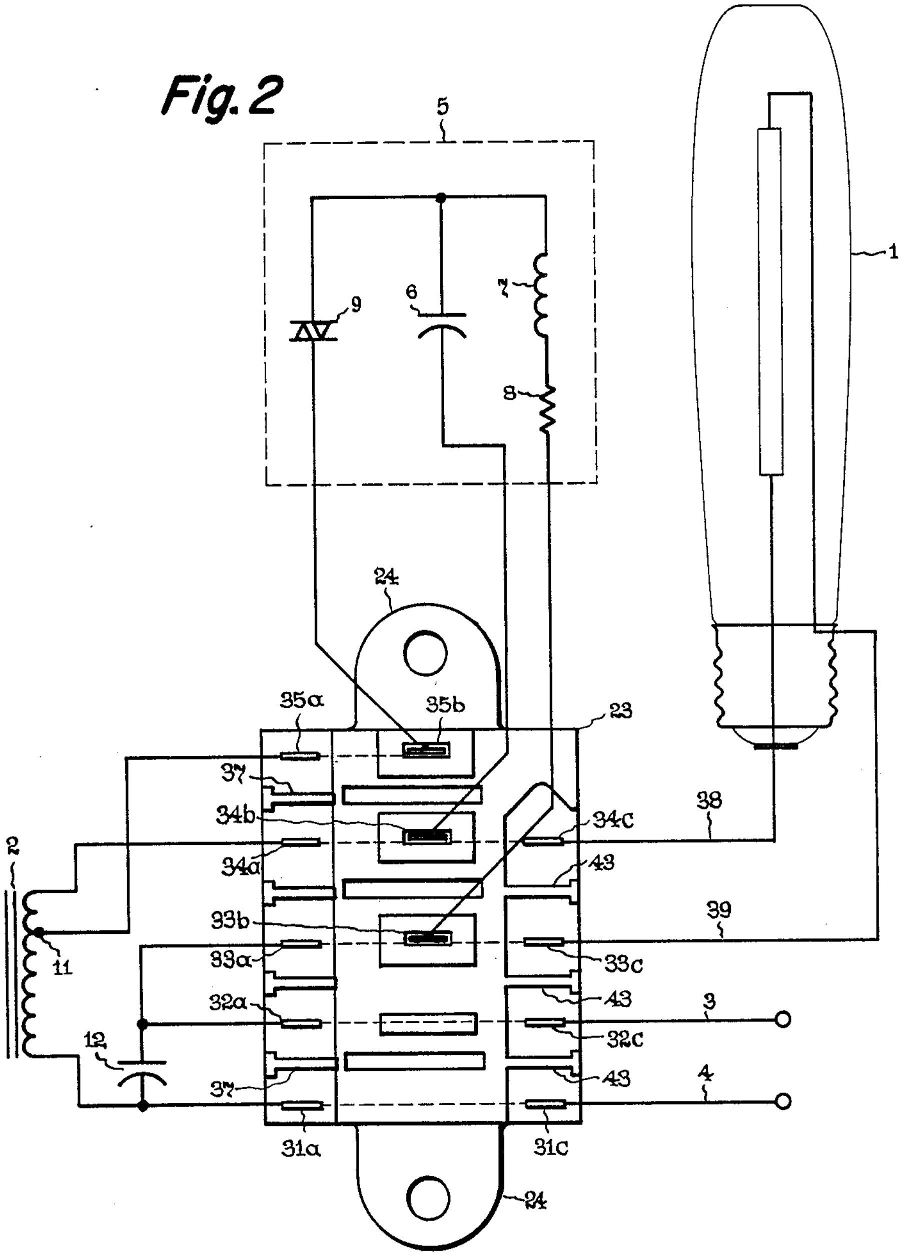
FIG. 2 is a schematic diagram of the starting aid and lamp-ballast circuit.

The lamp operating and starting circuit resulting from the interconnections between components shown or occurring in FIG. 1 after plugging in the starting aid and the disconnect plug is represented schematically in FIG. 2. It is essentially the circuit of FIG. 1 of previously mentioned U.S. Pat. No. 3,917,976—Nuckolls, whose disclosure is incorporated herein by reference. With this circuit, lamp current into high pressure sodium vapor lamp 1 is limited by ballast reactor 2 connected in series with the lamp across 115 volt, 60 hertz power line 3,4. High voltage high frequency pulses for starting the lamp are generated by starting aid 5 comprising capacitor 6, radio frequency choke coil 7 and resistor 8 connected in series in the order named across the lamp from high to low side. The threaded shell of the lamp base is shown connected through conductor 39 to the low side conductor 3 of the lamp in accordance with conventional wiring practice. A SIDAC 9, meaning a bilaterally conducting solid state switch which is triggered on only when the voltage across it exceeds a certain level, is connected to tap 11 near the output end of ballast reactor 2. Charging capacitor 6 and SIDAC 9 form a series discharge loop with a selected number of turns at the output end of ballast reactor 2. Connected across the line at the input side of ballast reactor 2 is a relatively large capacitor 12 which serves both as a high frequency bypass and a power factor improvement capacitor.

Prior to ignition, the voltage across capacitor 6 rises until the breakdown of SIDAC 9 suddenly discharges it through the tapped turns of reactor 2. Acting as a pulse transformer, reactor 2 steps up the pulse amplitude to 3000 volts or more which ignites the lamp. After the lamp has started, the pulsing mechanism is disabled as a result of the voltage clamping action of the lamp load which prevents the voltage buildup across capacitor 6 from reaching the breakdown level of SIDAC 9. Reference may be made to the Nuckolls patent for further details on the mode of operation of the circuit. A starting aid according to the Nuckolls circuit has been described by way of example, and it will be understood that other circuits may be used in plug-in starting aids embodying the invention.

In the preferred embodiment of the invention illustrated in FIG. 1, starting aid 5 has a rectangular open frame 13 made of a plastic suitable for molding. One plastic which we have used is polybutylene terephthalate which is available from General Electric Company under the designation Valox 325. Another suitable plastic material which is cheaper is fiber glass-filled polypropylene. Prior to molding, choke 7 and resistor 8 are joined, and together with capacitor 6 and SIDAC 9 have terminal connectors 15, 16, and 17 fastened to their lower ends while their upper ends are joined together through a connector strip 18. The parts are arranged to stand within the frame window and extend in the manner illustrated between the base portion 14 and the top portion 27 of the frame. The frame is molded around the root ends of the terminal connectors 15, 16 and 17 and completely around connector strip 18. These terminals and the connector strip are thus encased in plastic and protected thereby from environmental contaminants.

The base portion 14 of starting aid frame 13 is provided with three dependent legs 19, 20 and 21. The center leg 20 is a thicker guide leg assuring alignment when inserted into slot 20' in connector block 23. The outer two legs 19 and 21 are thinner but penetrate slots 19' and 21' of the same width as slot 20'. The thinner outer legs have inside hook ridges 22 and form deflectable cantilevered beams which bend in their respective slots as the hook ridges slide over the shoulders of the slots. The hook ridges serve as latches to provide snap retention and assure positive attachment which vibration will not loosen. Of course if it is desired to unplug the starting aid from the connector block, an adequate tug will cause the ridges to override the shoulders of slots 19' and 21' in the block. Serrated finger grips 26 are provided at the lower end of the frame walls to facilitate starting aid removal.

The starting aid may be used without connector block 23 and in such case it may be mounted flat down against the power module panel 10; or standing up using top portion 27 of frame 13 for a base. For flat mounting, a screw (not shown) is driven down through hole 28. Plastic lugs or stand-offs 29 are provided along the back edge of the side walls of frame 13 to allow the starting aid to be mounted flat against a metal panels without need for an insulating barrier. For stand-up mounting, the starting aid is fastened upside down by driving a screw through the hole in tab 30. This tab also assures that the starting aid is not mounted with the side not having the stand-offs 29 down flat against a metal surface. For connecting the starting aid in the absence of connector block 23, the terminals 15, 16 and 17 are of standard industrial configuration and will accommodate ordinary mating wire terminals such as those used on the connectors between the ballast components and terminals **31*a* to 35*a* of the connector block as shown in FIG. 1. When using wires and connectors, the legs 19, 20 and 21 serve as anti-arcing and safety barriers between the terminals 15, 16 and 17**.

The open structure of starting aid 5 as illustrated assures good component cooling by free air circulation. However, if an enclosed unit is desired, the rectangular shape facilitates the accommodation of snap-in covers.

While the invention has been described with reference to a particular embodiment utilizing a preferred arrangement of circuit components and a preferred configuration of a starting aid frame, it will be understood that it is equally applicable to variants of the circuit and of the configuration and that numerous modifications may be made by those skilled in the art without departing from the scope of the invention. The appended claims are intended to cover all such equivalent variations as come within the true spirit and scope of the invention.

What we claim as new and desire to secure by Letters Patent of the United States is:

1. A plug-in starting aid capable of generating high voltage pulses when interconnected to a ballast of an operating circuit for a high intensity discharge lamp, said starting aid comprising;

(a) interconnected electrical components requiring at least three connections into said operating circuit, said electrical components include at least a charging capacitor, a resistor and a voltage-sensitive switch, said charging capacitor being connected in series with said voltage-sensitive switch for forming a series discharge loop when said plug-in starting aid is interconnected to said ballast, operating circuit with turns at the output end of the ballast said capacitor also being connected in series with at least said resistor across said lamp to form a charging loop when said plug-in starting aid is interconnected with said ballast;

(b) a frame of insulating material in which said components are mounted said frame having a rigidity sufficient to withstand gripping and tugging without deforming so as to serve as said plug-in starting aid;

(c) at least three terminals projecting out of one side of said frame for said interconnection with said ballast and wherein a first of said terminals is connected to said voltage-sensitive switch, a second of said terminals is connected to said capacitor and a third of said terminals is connected to the end of said charging loop which is opposite from said connection of capacitor to said resistor, said terminals being adapted to be engageable by and mated with cooperating terminals.

2. A plug in starting aid according to claim 1 wherein the cooperative terminals are mounted on a connector block into which said starting aid may be plugged in and receive mechanical support therefrom.

3. A starting aid according to claim 2 wherein said frame has a base portion with legs of said insulating material projecting therefrom between said terminals and serving as safety barriers, one of said legs serving as a guide while penetrating into an accommodating slot in said connector block while being plugged in.

4. A starting aid according to claim 3 wherein at least one of said legs is relatively thin and flexible and has a hook ridge on one side which rides over a shoulder of an accommodating slot in said connector block while being plugged therein and provides snap retention.

5. A plug-in starting aid according to claim 1 wherein said cooperative terminals are standard mating wire terminals.

6. A starting aid according to claim 5 wherein said frame has cutouts for accepting fastening means to provide additional support for said frame when said starting aid is engaged with said standard mating wire terminals.

7. A starting aid according to claim 1 wherein said frame is generally rectangular.

8. A plug-in starting aid for generating high voltage pulses when interconnected to a ballast of an operating circuit for a high intensity discharge lamp, said starting aid comprising;

(a) interconnected electrical components requiring at least three connections into said operating circuit, said components being spatially disposed from each other and interconnected by leads of said components which have a spaced relationship to each other except for the portions of the leads which are connected to each other;

(b) at least three terminals connected to said components; and (c) a frame of insulating material having base, top, and side portions, said frame having a rigidity sufficient to withstand gripping and tugging without deforming so as to serve as said plug-in starting aid, said top portion having means for supporting one end of said interconnected electrical components and said base portion having said at least three terminals lodged therein and projecting therefrom, said top and base portions providing support for said spatially disposed interconnected electrical components extending therebetween and mounted on said frame, said terminals being adapted to be engageable by and mated with cooperating terminals.

9. A plug-in starting aid according to claim 8 wherein the cooperative terminals are mounted on a connector block into which said starting aid may be plugged in and receive mechanical support therefrom.

10. A starting aid according to claim 9 wherein said base portion of said frame has legs of said insulating material projecting therefrom between said terminals and serving as safety barriers, one of said legs serving as a guide while penetrating into an accommodating slot in said connector block while being plugged in.

11. A starting aid according to claim 10 wherein at least one of said legs is relatively thin and flexible and has a hook ridge on one side which rides over a shoulder of an accommodating slot in said connector block while being plugged therein and provides snap retention.

12. A plug-in starting aid according to claim 8 wherein said cooperative terminals are standard mating wire terminals.

13. A starting aid according to claim 12 wherein said frame has cutouts for accepting fastening means to provide additional support for said frame when said starting aid is engaged with said standard mating wire terminals.

14. A starting aid according to claim 8 wherein said frame is generally rectangular.

* * * * *